US007467878B2

(12) United States Patent
Li

(10) Patent No.: US 7,467,878 B2
(45) Date of Patent: Dec. 23, 2008

(54) HEAT-DISSIPATING STRUCTURE HAVING MULTIPLE HEAT PIPES FOR LED LAMP

(75) Inventor: Jia-Hao Li, Sindian (TW)

(73) Assignee: Jaffe Limited, Tortola (VG)

( * ) Notice: Subject to any disclaimer, the term of this patent is extended or adjusted under 35 U.S.C. 154(b) by 147 days.

(21) Appl. No.: 11/422,371

(22) Filed: Jun. 6, 2006

(65) Prior Publication Data

US 2007/0279909 A1 Dec. 6, 2007

(51) Int. Cl.
*F21V 29/00* (2006.01)
*H01L 29/22* (2006.01)

(52) U.S. Cl. ....................................... 362/294; 362/373

(58) Field of Classification Search ................. 362/294, 362/373

See application file for complete search history.

(56) References Cited

U.S. PATENT DOCUMENTS 7,270,446 B2 * 9/2007 Chang et al. ................ 362/294
7,329,030 B1 * 2/2008 Wang ......................... 362/373
2006/0044804 A1 * 3/2006 Ono et al. ................... 362/294
2007/0086196 A1 * 4/2007 Wong ......................... 362/294

OTHER PUBLICATIONS

U.S. Appl. No. 11/428,824 to Li,Jia-Hao, filed Jul. 5, 2006.*

* cited by examiner

*Primary Examiner*—Sandra O Shea
*Assistant Examiner*—James W Cranson

(57) ABSTRACT

A heat-dissipating structure having multiple heat pipes for a LED lamp is capable of performing the heat dissipation of the LED lamp. The heat-dissipating structure includes a seat to be heated and a plurality of heat pipes. The bottom surface of the seat to be heated has a surface to be heated for adhering to the LED lamp. The top surface of the seat to be heated has a heat-dissipating surface opposing to the surface to be heated. Each heat pipe has an end to be heated and a condensed end away from the end to be heated. On the heat-dissipating surface of the seat to be heated, a plurality of through holes is provided. The number of the through holes is consistent with that of the heat pipes. The axial direction of the end to be heated of the heat pipe is identical to that of the corresponding through hole, and is substantially perpendicular to the heat-dissipating surface of the seat to be heated.

5 Claims, 9 Drawing Sheets

HEAT-DISSIPATING STRUCTURE HAVING MULTIPLE HEAT PIPES FOR LED LAMP

BACKGROUND OF THE INVENTION

1. Field of the Invention

The present invention relates to a heat-dissipating structure having multiple heat pipes for a LED lamp, and in particular to a heat-dissipating structure having multiple heat pipes for a LED lamp, which is capable of performing the heat dissipation of the LED lamp by arranging the maximum number of LED lamps within the limited area.

2. Description of Prior Art

Since light-emitting diodes (LED) are high-intensity, energy-saved and long-life, they are widely used in the illumination of electronic devices or lamps. Further, in order to increase the illuminating range and intensity thereof, a plurality of light-emitting diodes are usually combined to form a LED lamp set. However, with the increase in the number of light-emitting diodes and the subsequent development of high-power light-emitting diodes, the heat generated by the operation of the light-emitting diodes is inevitably increasing. Therefore, it is an important issue for those skilled in this art to provide a heat-dissipating structure for LED lamps.

The existing heat-dissipating structure for the LED lamp is mainly constituted of heat pipes and fins. However, due to the restriction caused by the heat-dissipating device of the central processing unit (CPU) of the computer, it is still necessary for the heat pipes in the existing heat-dissipating structure for the LED lamp to be bent to form into a U-lettered or L-lettered shape, causing the reduction in the performance of the heat pipes. Further, the number of the heat pipes arranged within the limited area cannot be increased. Therefore, the conventional heat-dissipating structure cannot conform to the requirements for the heat dissipation of the LED lamp.

In view of the above, the inventor proposes the present invention to overcome the above problems based on his expert experiences and deliberate researches.

SUMMARY OF THE INVENTION

The present invention is to provide a heat-dissipating structure having multiple heat pipes for a LED lamp, in which each heat pipe is arranged upright on a seat to be heated. The seat to be heated adheres to a base plate of the LED lamp for heat dissipation. Since each heat pipe is arranged upright, the maximum number of the heat pipes arranged within the limited area of the seat to be heated can be increased. Further, it is not necessary for the heat pipes to be bent into a U-lettered or L-lettered shape. Therefore, the risk of reducing the performance of the heat pipe can be eliminated, so that it is more suitable for the heat dissipation of the LED lamp.

The present invention provides a heat-dissipating structure having multiple heat pipes for a LED lamp capable of performing the heat dissipation of the LED lamp. The heat-dissipating structure comprises a seat to be heated and a plurality of heat pipes. The bottom surface of the seat to be heated has a surface to be heated for adhering to the LED lamp. The top surface of the seat to be heated has a heat-dissipating surface opposing to the surface to be heated. Each heat pipe has an end to be heated and a condensed end away from the end to be heated. On the heat-dissipating surface of the seat to be heated, a plurality of through holes is provided. The number of the through holes is consistent with that of the heat pipes. The axial direction of the end of the heat pipe to be heated is identical to that of the corresponding through hole, and is substantially perpendicular to the heat-dissipating surface of the seat to be heated. With the above arrangement, a heat-dissipating structure having multiple heat pipes for a LED lamp can be obtained.

DETAILED DESCRIPTION OF THE INVENTION

In order to make the Examiner better understand the characteristics and the technical contents of the present invention, the following detailed description will be made with reference to the accompanying drawings. However, it should be understood that the drawings are illustrative but not used to limit the scope of the present invention.

Figure 7:
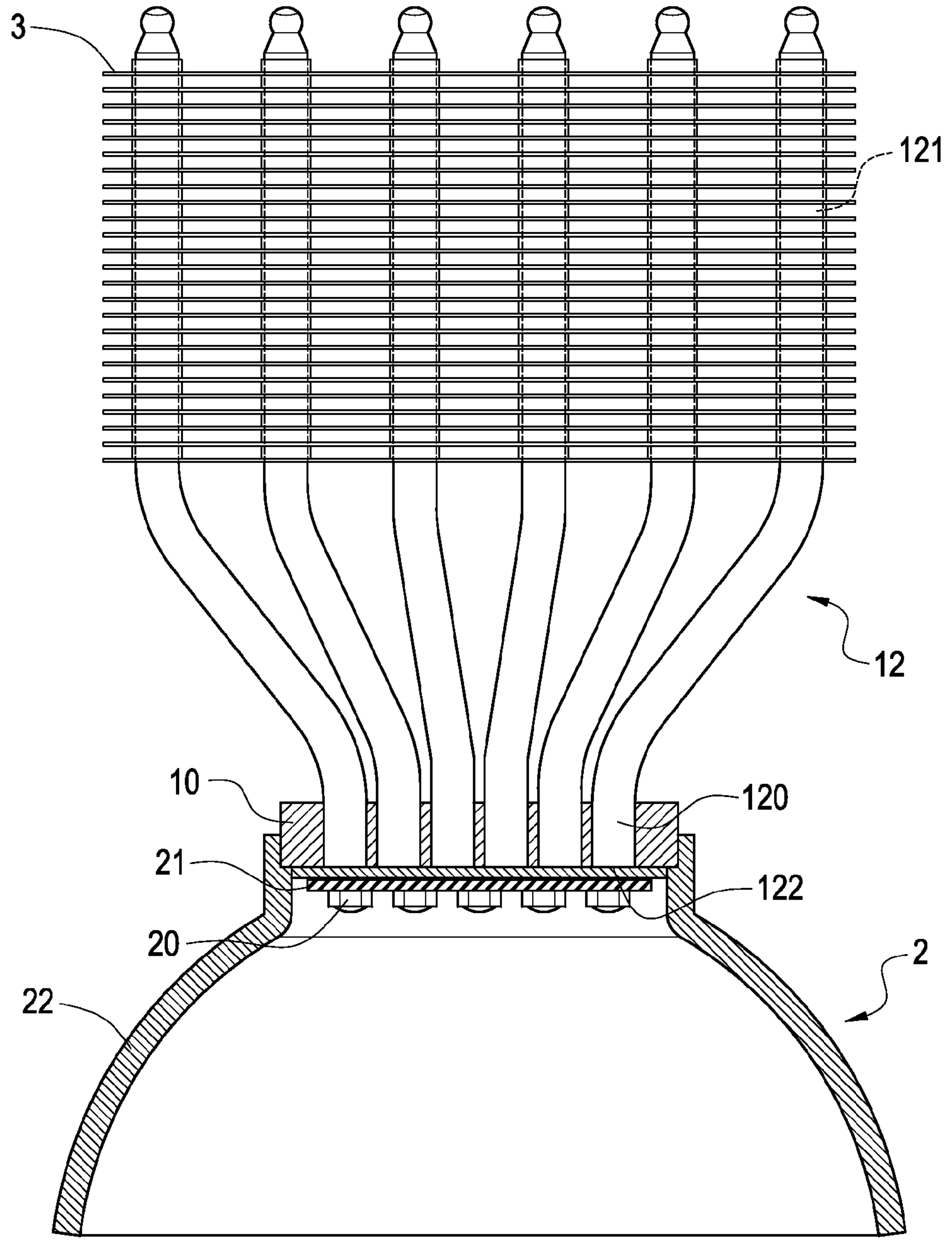
FIG. 7 is an assembled view showing that the present invention is applied to a LED lamp.

With reference to FIG. 7 first, it is an assembled view showing that the present invention is applied to the LED lamp. The present invention provides a heat-dissipating structure having multiple heat pipes for a LED lamp. The LED lamp 2 includes a plurality of light-emitting diodes (LED) 20 a base plate 21 for providing the light-emitting diodes 20 thereon, and a lamp cover 22 covering outside the base plate 21. The heat-dissipating structure is provided in the rear of the lamp cover 22 and adheres to the back of the base plate 21, thereby to dissipate the heat generated by the light-emitting diodes 20.

Figure 1:
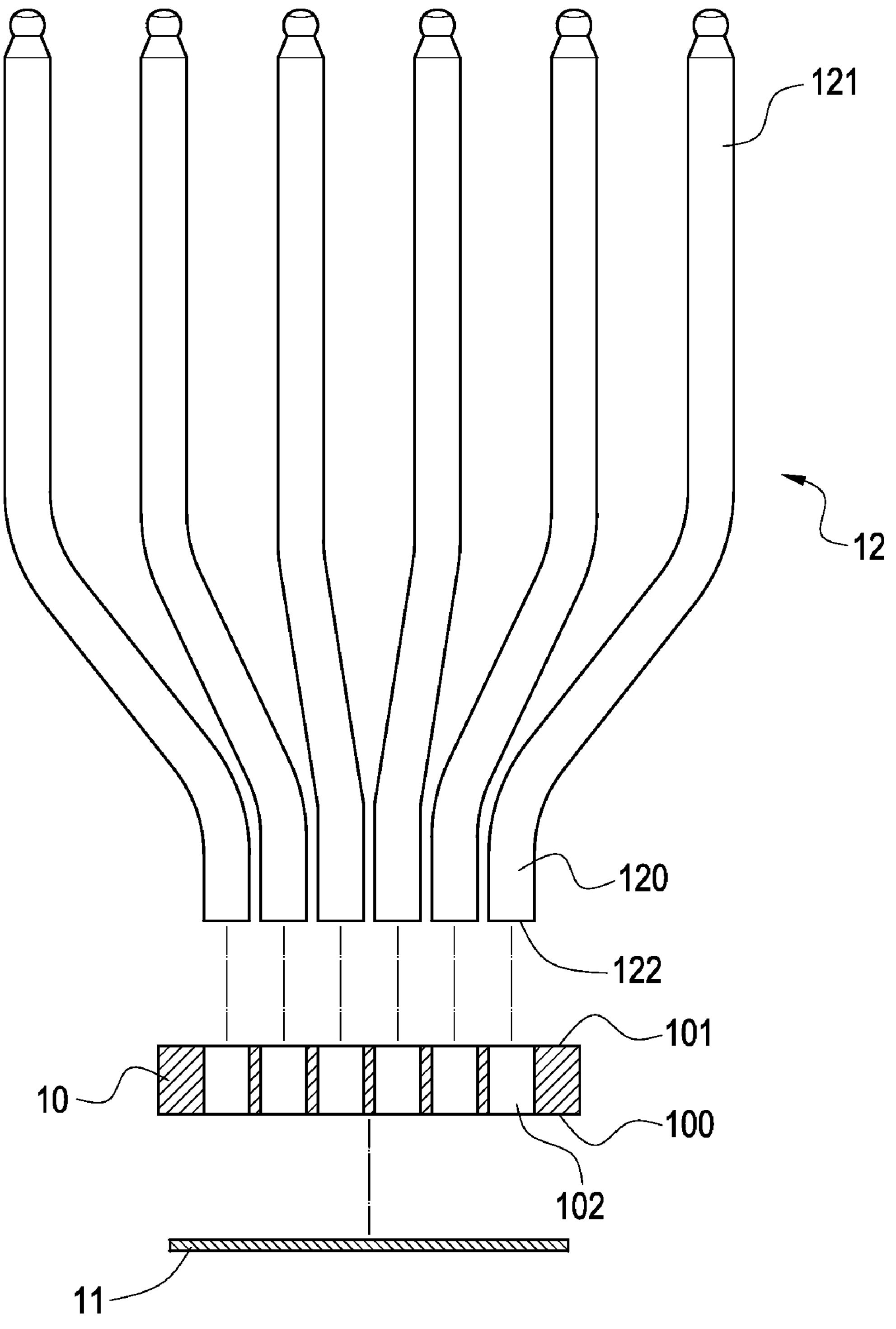
FIG. 1 is an exploded perspective view of the present invention.
Figure 2:
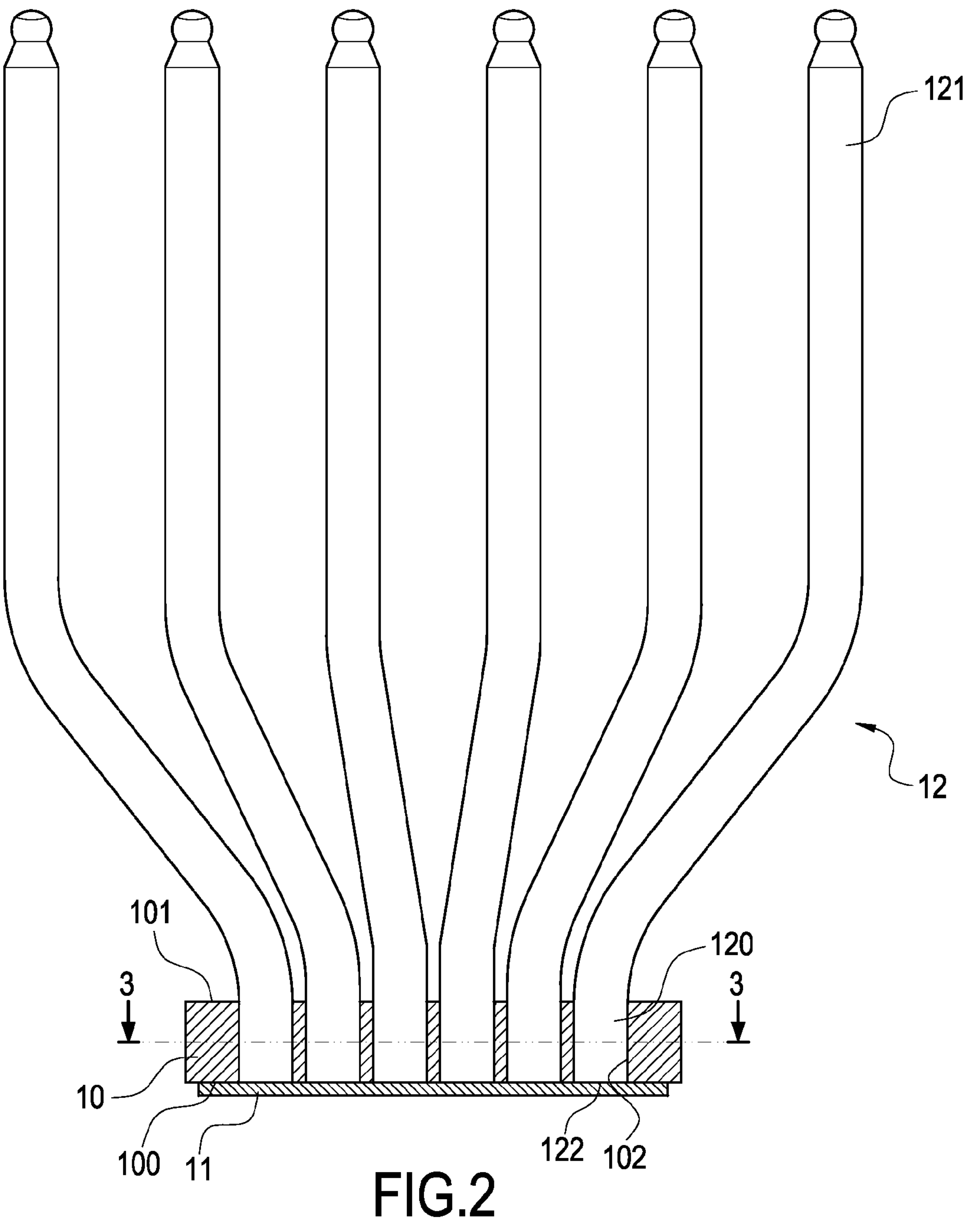
FIG. 2 is an assembled view of the present invention.

With reference to FIG. 1 and FIG. 2, the heat-dissipating structure 1 comprises a seat 10 to be heated and a plurality of heat pipes 12.

Figure 3:
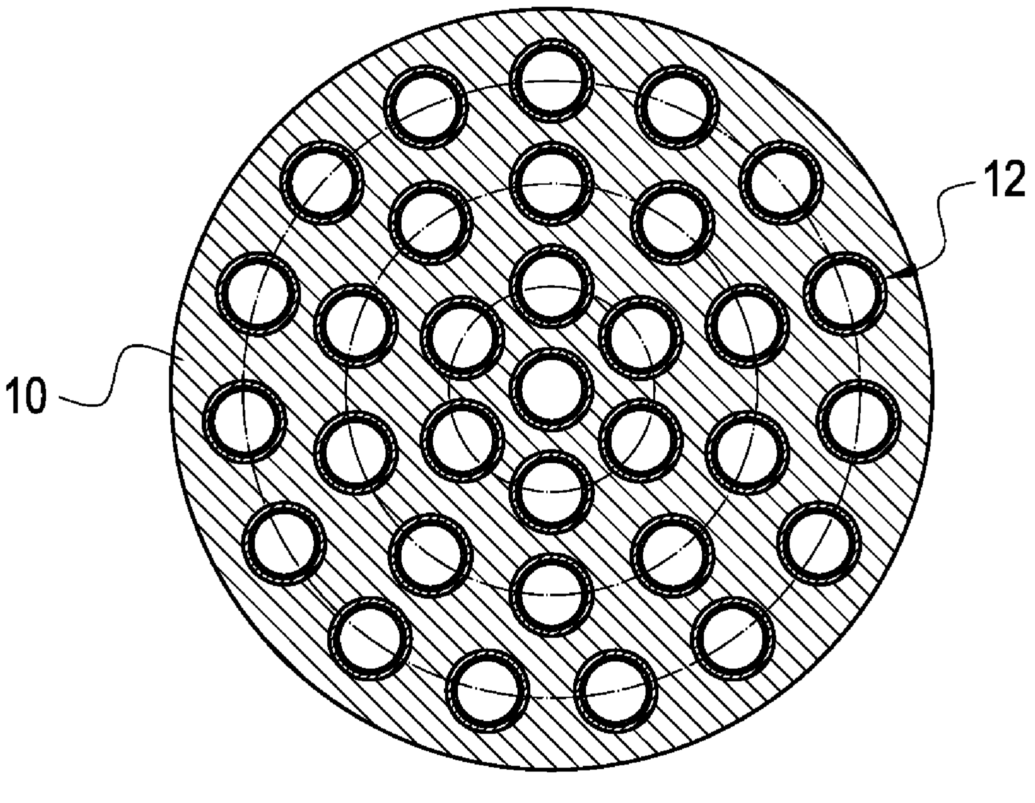
FIG. 3 is a cross-sectional view taken along the line 3-3 of FIG. 2.

The seat 10 to be heated can be made of materials having good heat conductivity (such as aluminum or copper) and is formed into a plate body. The bottom surface of the seat 10 to be heated has a surface 100 to be heated for adhering to the back surface of the base plate 21 of the LED lamp 21 (FIG. 7). The surface 100 to be heated is substantially a flat surface. On the other hand, the top surface of the seat 10 to be heated has a heat-dissipating surface 101 opposing to the surface 100 to be heated. A plurality of through holes 102 is provided to penetrate through the heat-dissipating surface 101 and the surface 100 to be heated. Those through holes 102 can be distributed in several concentric circles (FIG. 3), and the number of the through holes 102 is consistent with that of the heat pipes 12.

In the present embodiment, each through hole 102 is a hole penetrating through the heat-dissipating surface 101 of the seat 10 to be heated and the surface 100 to be heated. In order to make the surface 100 to be heated adhere to the back surface of the base plate 21 of the LED lamp 2, a plate 11 to be heated is adhered to the surface 100 of the seat 10 to be heated. In this way, not only the seat 10 to be heated adheres to the back surface of the base plate 21 of the LED lamp 2 more easily, but also the contacting area between the seat 10 to be heated and the base plate 21 of the LED lamp 2 can be increased.

Each above-mentioned heat pipe 12 has an end 120 to be heated and a condensed end 121 away from the end 120 to be heated. The end 120 to be heated of each heat pipe 12 penetrates into the through hole 102 of the seat 10 to be heated 10 and is brought in thermal contact therewith and connected thereto. The axial direction of the end 120 to be heated of the heat pipe 12 is identical to that of the corresponding through hole 102 and is substantially perpendicular to the heat-dissipating surface 101. In addition, the bottom of the end 120 to be heated of the heat pipe 12 can be formed into a plane 122 made by machining process, so that it can adhere to the plate 11 to be heated or the bottom surface of each through hole 102 (FIG. 5) to increase the contacting area. Thereby, the bottom of the heat pipe 12 can be directly heated. Further, the condensed end 121 of each heat pipe 12 expands outwardly with the center of the heat-dissipating surface 101 as a center of circle. In this way, the ends 120 to be heated of the heat pipes 12 can be heated in a concentrated manner. On the contrary, the condensed ends 121 are distributed to expand outwardly to increase the space for condensing, thereby to facilitate the heat dissipation.

Figure 4:
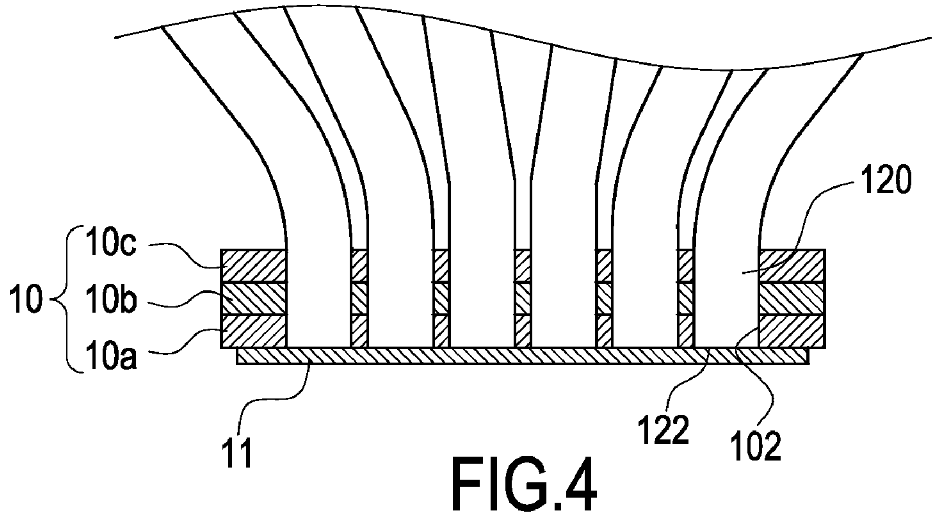
FIG. 4 is a partial schematic view showing the seat to be heated of another embodiment of the present invention.

As shown in FIG. 4, the seat 10 to be heated can be also formed of stacking vertically a plurality of slice plate bodies 10*a*, 10*b* and 10*c*. Each plate body 10*a*, 10*b*, 10*c* adheres to and is flush with each other. In this way, it is convenient for each plate body 10*a*, 10*b* and 10*c* to penetrate orderly into the end 120 to be heated of each heat pipe 12 by pressing, thereby to reduce the difficulty in penetration.

Figure 5:
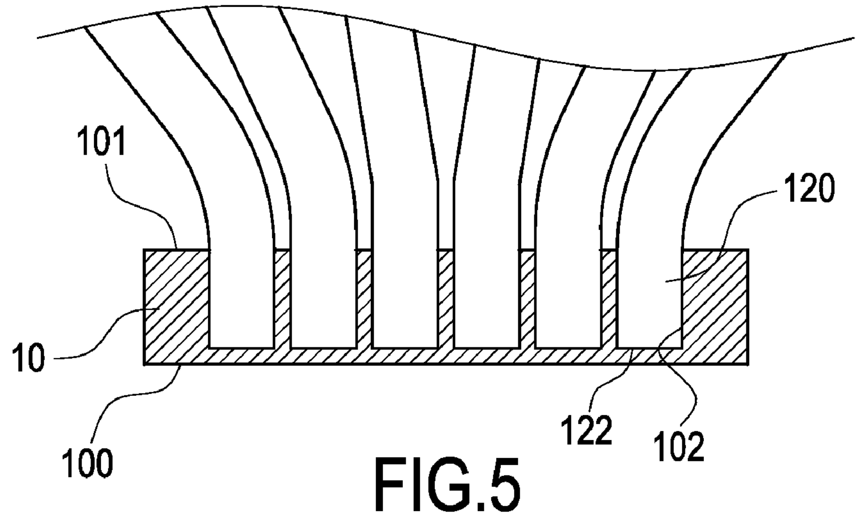
FIG. 5 is a partial schematic view showing the seat to be heated of still another embodiment of the present invention.

As shown in FIG. 5, each through hole 102 arranged on the seat 10 to be heated can be a blind hole, which penetrates from the heat-dissipating surface 101 of the seat 10 to be heated into the seat 10 to be heated without penetrating therethrough. Thus, it is not necessary to adhere the plate 11 to be heated onto the surface 100 to be heated, and the flatness of the surface 100 to be heated can be still maintained. In this way, the degree of adhering and the contacting area between the surface 100 to be heated and the base plate 21 of the LED lamp 2 can be increased.

Figure 6:
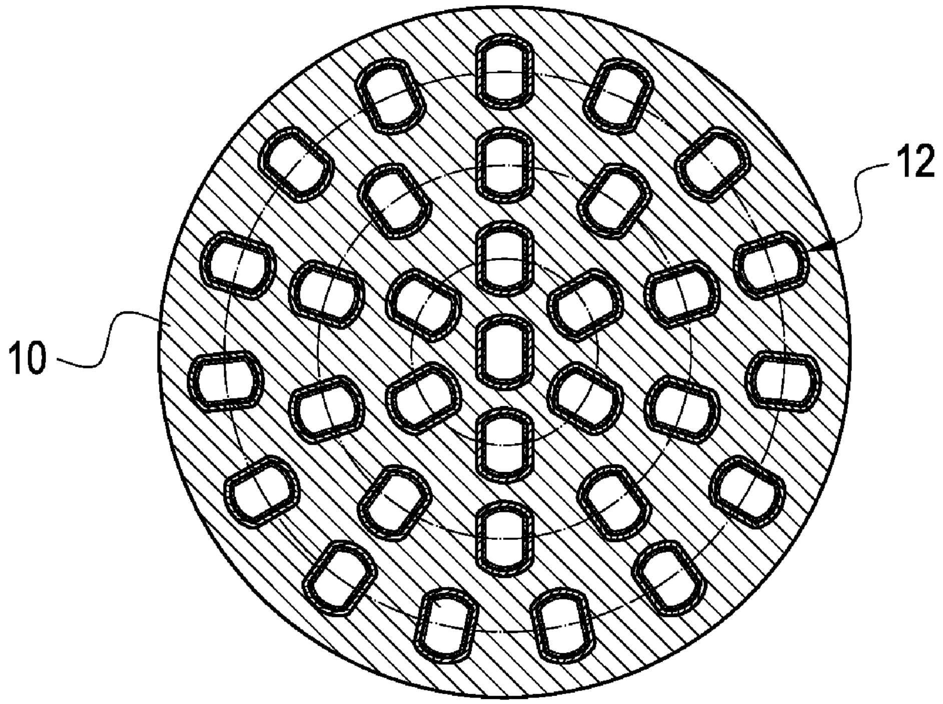
FIG. 6 is a cross-sectional view showing the profile of the heat pipe of another embodiment in accordance with FIG. 3.

As shown in FIG. 6, the profile of the end 120 to be heated of each heat pipe 12 corresponds to that of the corresponding through hole 102. Each through hole 102 of the seat 10 to be heated can be formed into a non-circular shape. The non-circular shape can be polygonal, oval or other geometric shape. Alternatively, the profile of the through hole may be provided with at least one flat surface. Since the circular profile of the through hole lets the heat pipe to rotate therein and thus causes the difficulty in positioning or fixing the heat pipe 12 and the through hole 102, such problem can be prevented by using the through hole having non-circular profile. In the present embodiment, the end 120 to be heated of each heat pipe 12 is formed into a flat pipe to correspond to the profile of the through hole 102.

Therefore, with the above structure, the heat-dissipating structure having multiple heat pipes for a LED lamp can be achieved.

According to the above, as shown in FIG. 7, the characteristic of the present invention lies in that the heat pipes 12 are provided upright on the seat 10 to be heated, so that the number of the heat pipes arranged within the limited area of the heat-dissipating surface 101 of the seat 10 to be heated can be raised to a maximum. Further, since each heat pipe 12 is provided upright, it is not necessary to bend the heat pipe into a U-lettered or L-lettered shape, so that the risk of reducing the performance of the heat pipe 12 caused by bending can be eliminated. With the above arrangement, it becomes much easier to assemble each heat pipe 12 with the seat 10 to be heated. Therefore, the manufacturing process also becomes easier so as to reduce the amount of the solder. Of course, the condensed end 121 of each heat pipe 12 can be also provided with a plurality of heat-dissipating fins 3 in common to facilitate the condensed end 121 of each heat pipe 12 to perform the heat dissipation.

Figure 8:
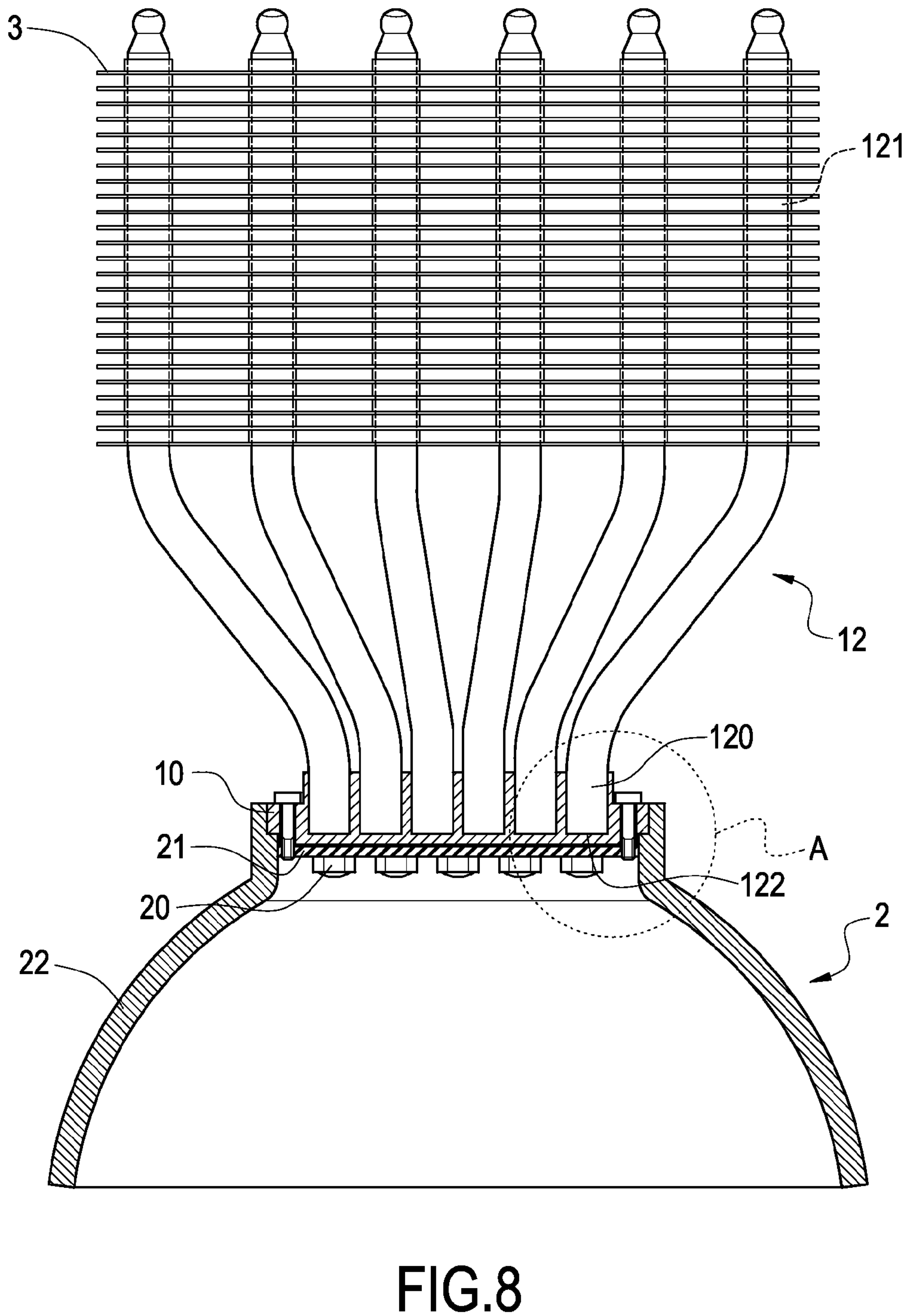
FIG. 8 is an assembled view showing that another embodiment of the present invention is applied to a LED lamp.
Figure 9:
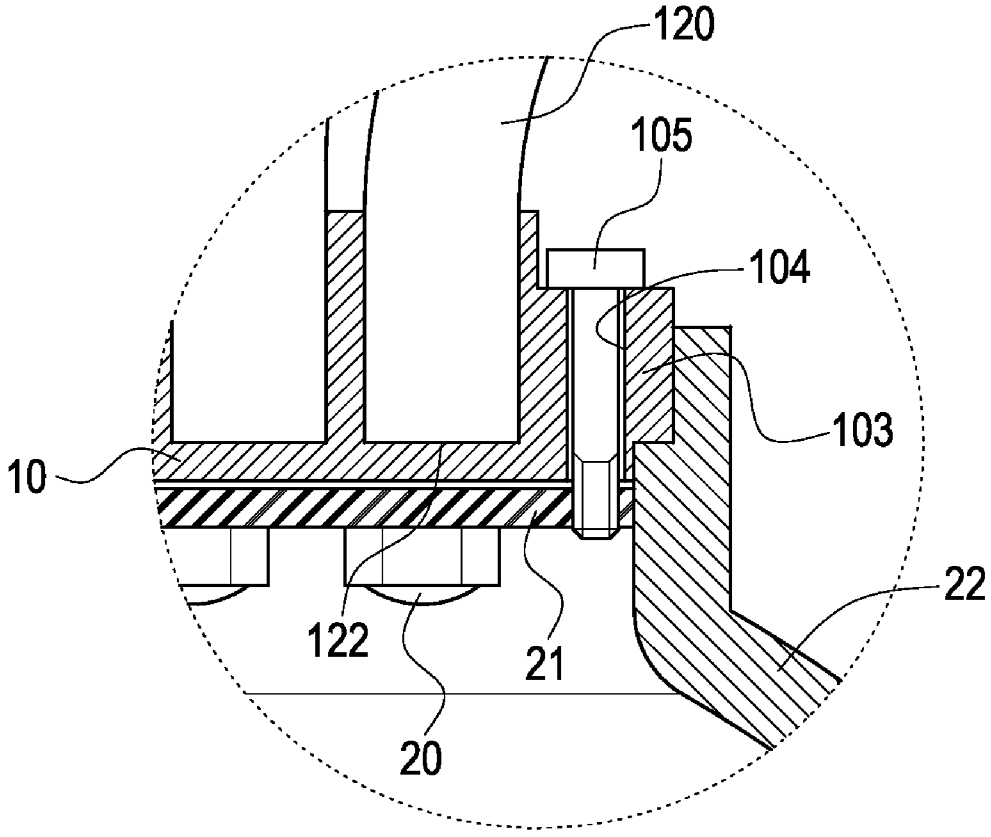
FIG. 9 is an enlarged view showing the details of the portion A in FIG. 8.

Further, as shown in FIG. 8 and FIG. 9, a flange 103 protrudes horizontally and outwardly from the outer edge of the seat 10 to be heated. With this arrangement, the heat-dissipating structure 1 can be locked or engaged with the LED lamp 2 by fixing the flange 103 with any suitable fixing elements (not shown). Alternatively, the flange 103 is provided with a plurality of screw holes 104, so that a screw 105 can penetrate into each screw hole 104 and is locked on the base plate 21 of the LED lamp 2. With the above arrangement, the heat-dissipating structure 1 and the LED lamp 2 can be combined with each other.

Figure 10:
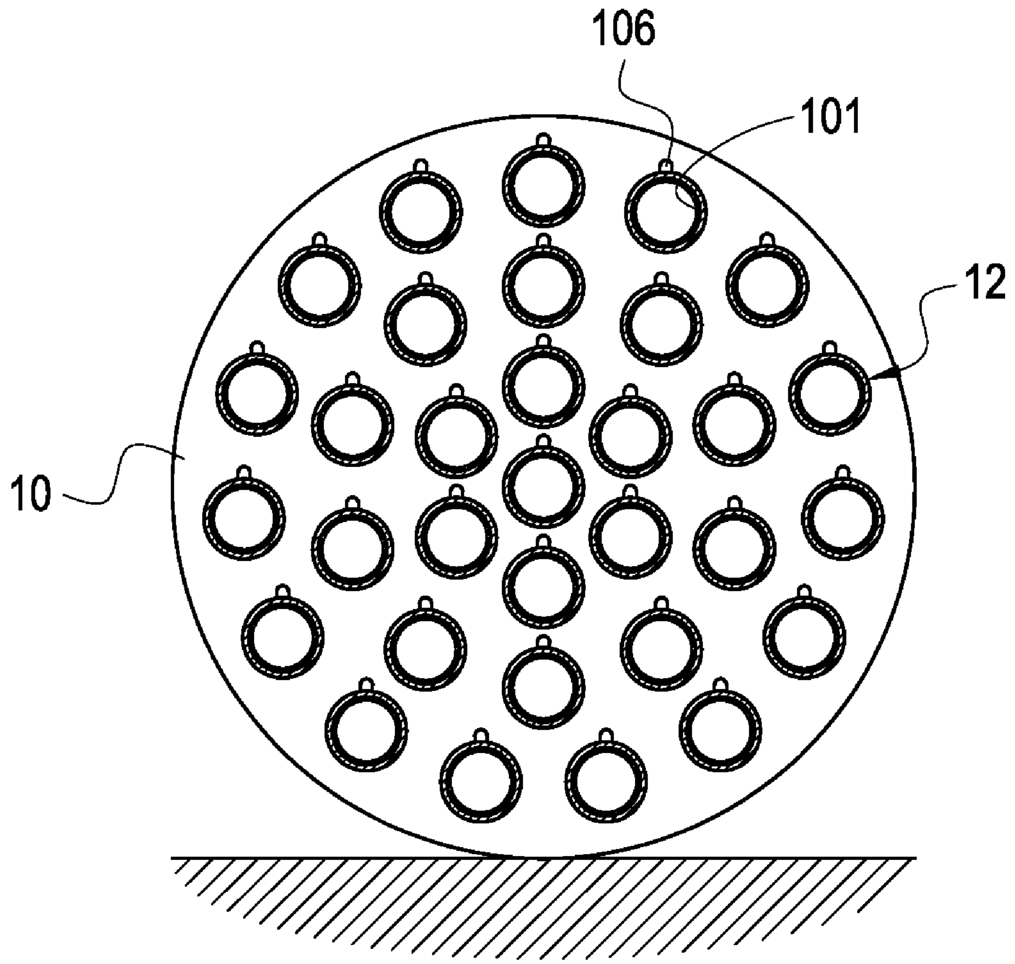
FIG. 10 is schematic view showing the combination of the seat to be heated and the heat pipe.

Further, as shown in FIG. 10, the edge of each through hole 102 of the seat 10 to be heated 10 can be provided with a small hole 106. When the end 120 to be heated of each heat pipe 12 penetrates into each through hole 102, the seat 10 to be heated can be erected laterally (that is, each heat pipe 12 is arranged horizontally) so that the small hole 106 of each through hole 102 is located at an upper position. Then, a heat-conducting medium such as heat-conducting paste or solder is injected into each small hole 106, so that the heat-conducting medium flows into the gap between the end 120 to be heated of the heat pipe 12 and the through hole 102. Finally, the seat 10 to be heated and each heat pipe 12 can be connected to each other by welding.

According to the above, the present invention indeed achieves the desired effects by employing the above-mentioned structure. Therefore, the present invention has novelty and inventive steps and completely conforms to the requirements for a utility model patent.

Although the present invention has been described with reference to the foregoing preferred embodiments, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A heat-dissipating structure having multiple heat pipes for a LED lamp for performing heat dissipation of the LED lamp, comprising:

a seat to be heated, a bottom side of the seat having a surface to be heated for adhering to the LED lamp, and a top side thereof having a heat-dissipating surface opposing to the surface to be heated; and a plurality of heat pipes, each heat pipe having an end to be heated and a condensed end away form the end to be heated, wherein the heat-dissipating surface of the seat to be heated is provided with a plurality of through holes, the number of the through holes is consistent with that of the heat pipes, an axial direction of the end to be heated of the heat pipe is identical to that of corresponding through hole and is substantially perpendicular to the heat-dissipating surface of the seat to be heated, and wherein the seat to be heated is formed of stacking vertically a plurality of plate bodies, and the plate bodies adhere to and are flush with each other.

2. A heat-dissipating structure having multiple heat pipes for a LED lamp for performing heat dissipation of the LED lamp, comprising:

a seat to be heated a bottom side of the seat having a surface to be heated for adhering to the LED lamp and a top side thereof having a heat-dissipating surface opposing to the surface to be heated; and a plurality of heat pipes, each heat pipe having en end to be heated and a condensed end away form the end to be heated, wherein the heat-dissipating surface of the seat to be heated is provided with a plurality of through holes, the number of the through holes is consistent with that of the heat pipes, an axial direction of the end to be heated of the heat pipe is identical to that of corresponding through hole and is substantially perpendicular to the heat-dissipating surface of the seat to be heated, and wherein each through hole of the seat to be heated is a blind hole.

3. A heat-dissipating structure having multiple heat pipes for a LED lamp for performing heat dissipation of the LED lamp, comprising:

a seat to be heated, a bottom side of the seat having a surface to be heated for adhering to the LED lamp, and a top side thereof having a heat-dissipating surface opposing to the surface to be heated; and a plurality of heat pipes, each heat pipe having an end to be heated and a condensed end away form the end to be heated, wherein the heat-dissipating surface of the seat to be heated is provided with a plurality of through holes, the number of the through holes is consistent with that of the heat pipes, an axial direction of the end to be heated of the heat pipe is identical to that of corresponding through hole and is substantially perpendicular to the heat-dissipating surface of the seat to be heated, and wherein a flange protrudes horizontally and outwardly from an outer edge of the seat to be heated, the flange is provided with a plurality of screw holes, and a screw penetrates into each screw hole and is locked on the LED lamp.

4. A heat-dissipating structure having multiple heat pipes for a LED lamp for performing heat dissipation of the LED lamp, comprising:

a seat to be heated, a bottom side of the seat having a surface to be heated for adhering to the LED lamp and a top side thereof having a heat-dissipating surface opposing to the surface to be heated; and a plurality of heat pipes each heat pipe having an end to be heated and a condensed end away form the end to be heated, wherein the heat-dissipating surface of the seat to be heated is provided with a plurality of through holes, the number of the through holes is consistent with that of the heat pipes, an axial direction of the end to be heated of the heat pipe is identical to that of corresponding through hole and is substantially perpendicular to the heat-dissipating surface of the seat to be heated, and wherein an edge of the through hole of the seat to be heated is provided with a small hole.

5. A heat-dissipating structure having multiple heat pipes for a LED lamp for performing heat dissipation of the LED lamp, comprising:

a seat to be heated, a bottom side of the seat having a surface to be heated for adhering to the LED lamp, and a top side thereof having a heat-dissipating surface opposing to the surface to be heated; and a plurality of heat pipes, each heat pipe having an end to be heated and a condensed end away form the end to be heated, wherein the heat-dissipating surface of the seat to be heated is provided with a plurality of through holes, the number of the through holes is consistent with that of the heat pipes, an axia1 direction of the end to be heated of the heat pipe is identical to that of corresponding through hole and is substantially perpendicular to the heat-dissipating surface of the seat to be heated, and wherein the condensed end of each heat pipe expends outwardly with a center of the heat-dissipating surface of the seat to be heated as a center of circle.

* * * * *